US009956744B2

(12) United States Patent
Sun et al.

(10) Patent No.: US 9,956,744 B2
(45) Date of Patent: *May 1, 2018

(54) SHELL, METHOD OF PREPARING THE SHELL AND ELECTRONIC PRODUCT COMPRISING THE SHELL

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventors: Jian Sun, Guangdong (CN); Juan Zeng, Guangdong (CN); Yunxia Zhang, Guangdong (CN); Jun Cheng, Guangdong (CN)

(73) Assignees: Shenzhen BYD Auto R&D Company Limited, Shenzhen (CN); BYD Company Limited, Shenzhen (CN)

( * ) Notice: Subject to any disclaimer, the term of this patent is extended or adjusted under 35 U.S.C. 154(b) by 344 days.

This patent is subject to a terminal disclaimer.

(21) Appl. No.: 14/466,932

(22) Filed: Aug. 22, 2014

(65) Prior Publication Data
US 2014/0363623 A1 Dec. 11, 2014

Related U.S. Application Data

(63) Continuation of application No. PCT/CN2012/082029, filed on Sep. 26, 2012.

(30) Foreign Application Priority Data

Feb. 24, 2012 (CN) .......................... 2012 1 0043628

(51) Int. Cl.
*B32B 7/04* (2006.01)
*C25D 11/08* (2006.01)
(Continued)

(52) U.S. Cl.
CPC ................ *B32B 7/04* (2013.01); *B29B 13/00* (2013.01); *B29C 45/14311* (2013.01);
(Continued)

(58) Field of Classification Search
CPC ............. B29C 66/721; B29C 45/14311; B29C 45/14795; B32B 7/04; B32B 13/00
(Continued)

(56) References Cited

U.S. PATENT DOCUMENTS 4,040,981 A 8/1977 Inaba et al.
4,154,705 A 5/1979 Baldi
(Continued)

FOREIGN PATENT DOCUMENTS

CN 1639387 A 7/2005
CN 1706992 A 12/2005
(Continued)

OTHER PUBLICATIONS

Database CA [Online] Chemical Abstracts Service, Jan. 26, 2006, Taisei Plas Co., Ltd., Japan: Composite materials of anodized aluminum alloys and thermoplastic resins, and their manufacture by injection molding, and Abstract for JP 2006-001216, Jan. 5, 2006 (3 pages).
(Continued)

*Primary Examiner* — Brent T O'Hern

(57) ABSTRACT

A shell, a method of preparing the shell and an electronic product comprising the shell are provided. The shell may comprise: a metal shell body, a plastic part made of a resin, and an oxide layer formed between the metal body and the plastic part, joining the plastic part to the metal shell body, wherein the oxide layer contains corrosion pores having an average diameter of about 200 nm to about 2000 nm in the surface contacting the plastic part, and nanopores having a diameter of about 10 to 100 nm in the surface contacting the
(Continued)

metal shell body, and a part of the resin is filled in the corrosion pore and corrosion pore.

13 Claims, 5 Drawing Sheets

(51) Int. Cl.

| | | |
|---|---|---|
| C25D 11/16 | (2006.01) | |
| C25D 11/24 | (2006.01) | |
| B29B 13/00 | (2006.01) | |
| B29C 45/14 | (2006.01) | |
| B29C 45/72 | (2006.01) | |
| B29C 71/02 | (2006.01) | |
| H04M 1/02 | (2006.01) | |
| H05K 5/00 | (2006.01) | |
| B32B 7/12 | (2006.01) | |
| B32B 15/08 | (2006.01) | |
| B29K 81/00 | (2006.01) | |
| B29K 705/02 | (2006.01) | |
| B29L 31/34 | (2006.01) | |

(52) U.S. Cl.
CPC .... *B29C 45/14795* (2013.01); *B29C 45/7207* (2013.01); *B29C 71/02* (2013.01); *B32B 7/12* (2013.01); *B32B 15/08* (2013.01); *C25D 11/08* (2013.01); *C25D 11/16* (2013.01); *C25D 11/24* (2013.01); *C25D 11/246* (2013.01); *H04M 1/0202* (2013.01); *H05K 5/0091* (2013.01); B29C 2045/14868 (2013.01); B29C 2071/022 (2013.01); B29K 2081/04 (2013.01); B29K 2705/02 (2013.01); B29K 2715/003 (2013.01); B29L 2031/3481 (2013.01); B32B 2457/00 (2013.01); B32B 2457/208 (2013.01); Y10T 428/24174 (2015.01); Y10T 428/24917 (2015.01); Y10T 428/31507 (2015.04); Y10T 428/31533 (2015.04)

(58) Field of Classification Search
USPC ......................................................... 428/119
See application file for complete search history.

(56) References Cited

U.S. PATENT DOCUMENTS

| | | | |
|---|---|---|---|
| 4,179,412 | A | 12/1979 | Inaba et al. |
| 4,499,237 | A | 2/1985 | Tracke |
| 4,687,551 | A | 8/1987 | Furneaux et al. |
| 5,021,504 | A | 6/1991 | Fujita |
| 5,332,780 | A | 7/1994 | Kitazawa et al. |
| 5,602,200 | A | 2/1997 | Wissmann |
| 5,951,747 | A | 9/1999 | Lewis |
| 6,495,225 | B1 | 12/2002 | Nakajima et al. |
| 6,804,081 | B2 | 10/2004 | Den et al. |
| 7,841,577 | B2 | 11/2010 | Yamaguchi et al. |
| 7,879,734 | B2 | 2/2011 | Fukutani et al. |
| 8,703,272 | B2 | 4/2014 | Naritomi et al. |
| 2001/0036559 | A1 | 11/2001 | Ulrich et al. |
| 2002/0033108 | A1 | 3/2002 | Akiyama et al. |
| 2002/0040888 | A1 | 4/2002 | Marczak et al. |
| 2003/0001274 | A1 | 1/2003 | Den et al. |
| 2003/0180555 | A1 | 9/2003 | Wakayama et al. |
| 2004/0013931 | A1 | 1/2004 | Takamura et al. |
| 2004/0062943 | A1 | 4/2004 | Naritomi et al. |
| 2004/0142503 | A1 | 7/2004 | Lee et al. |
| 2004/0229031 | A1 | 11/2004 | Gell et al. |
| 2006/0046602 | A1 | 3/2006 | Kang |
| 2006/0054589 | A1 | 3/2006 | Omori et al. |
| 2006/0055084 | A1 | 3/2006 | Yamaguchi et al. |
| 2006/0057492 | A1 | 3/2006 | Kunita |
| 2006/0088680 | A1 | 4/2006 | Kitahara |
| 2006/0127684 | A1* | 6/2006 | Naritomi ........... B29C 45/14311 428/457 |
| 2006/0257624 | A1 | 11/2006 | Naritomi et al. |
| 2007/0096359 | A1 | 5/2007 | Torfs |
| 2007/0116934 | A1 | 5/2007 | Miller |
| 2007/0196637 | A1 | 8/2007 | Good et al. |
| 2008/0041257 | A1 | 2/2008 | Teng |
| 2008/0057336 | A1 | 3/2008 | Kurokawa et al. |
| 2008/0070152 | A1 | 3/2008 | Yu |
| 2008/0081867 | A1 | 4/2008 | Sakata et al. |
| 2008/0102404 | A1 | 5/2008 | Tashiro et al. |
| 2009/0017242 | A1 | 1/2009 | Weber et al. |
| 2009/0075156 | A1 | 3/2009 | Long et al. |
| 2009/0155522 | A1 | 6/2009 | Raghavendran |
| 2009/0202840 | A1 | 8/2009 | Griebel et al. |
| 2009/0274889 | A1 | 11/2009 | Iwahashi et al. |
| 2009/0280296 | A1 | 11/2009 | Naritomi et al. |
| 2009/0304970 | A1 | 12/2009 | Imaizumi et al. |
| 2010/0018025 | A1 | 1/2010 | Naritomi et al. |
| 2010/0021718 | A1 | 1/2010 | Vos et al. |
| 2010/0028602 | A1 | 2/2010 | Naritomi et al. |
| 2010/0150826 | A1 | 6/2010 | Troczynski et al. |
| 2010/0177392 | A1 | 7/2010 | Masuda et al. |
| 2010/0189958 | A1 | 7/2010 | Naritomi et al. |
| 2010/0190029 | A1 | 7/2010 | Ueki |
| 2010/0215965 | A1 | 8/2010 | Tadaki |
| 2010/0218827 | A1 | 9/2010 | Aono et al. |
| 2010/0255732 | A1 | 10/2010 | Kohmura et al. |
| 2010/0283165 | A1 | 11/2010 | Ihara |
| 2010/0304083 | A1 | 12/2010 | Naritomi et al. |
| 2010/0316878 | A1 | 12/2010 | Naritomi et al. |
| 2011/0008644 | A1 | 1/2011 | Naritomi et al. |
| 2011/0111214 | A1 | 5/2011 | Endo et al. |
| 2011/0165342 | A1 | 7/2011 | Imai et al. |
| 2011/0250377 | A1* | 10/2011 | Qin ................... B29C 45/14311 428/99 |
| 2011/0281135 | A1 | 11/2011 | Gong et al. |
| 2011/0297549 | A1 | 12/2011 | Chen et al. |
| 2011/0300400 | A1 | 12/2011 | Tomita et al. |
| 2011/0305893 | A1 | 12/2011 | Chang et al. |
| 2011/0318585 | A1 | 12/2011 | Su et al. |
| 2012/0015186 | A1 | 1/2012 | Honma et al. |
| 2012/0039066 | A1 | 2/2012 | Hatanaka et al. |
| 2012/0043689 | A1 | 2/2012 | Chang et al. |
| 2012/0094108 | A1 | 4/2012 | Chang et al. |
| 2012/0168990 | A1 | 7/2012 | Kuwahara et al. |
| 2012/0213971 | A1 | 8/2012 | Ihara |
| 2012/0237755 | A1 | 9/2012 | Chang et al. |
| 2013/0043043 | A1 | 2/2013 | Tai et al. |
| 2013/0052582 | A1 | 2/2013 | Hayashi |
| 2013/0078423 | A1 | 3/2013 | Sutou et al. |
| 2013/0242487 | A1 | 9/2013 | Fujioka et al. |
| 2014/0360974 | A1 | 12/2014 | Sun et al. |
| 2014/0363623 | A1 | 12/2014 | Sun et al. |
| 2014/0363631 | A1 | 12/2014 | Gong et al. |
| 2014/0363657 | A1 | 12/2014 | Gong et al. |
| 2014/0363658 | A1 | 12/2014 | Sun et al. |
| 2014/0363659 | A1 | 12/2014 | Sun et al. |
| 2014/0363660 | A1 | 12/2014 | Gong et al. |
| 2014/0363686 | A1 | 12/2014 | Sun et al. |

FOREIGN PATENT DOCUMENTS

| | | |
|---|---|---|
| CN | 1717323 A | 1/2006 |
| CN | 101010452 A | 8/2007 |
| CN | 101313087 A | 11/2008 |
| CN | 101341023 A | 1/2009 |
| CN | 101578170 A | 11/2009 |
| CN | 101607446 A | 12/2009 |
| CN | 101743111 A | 6/2010 |
| CN | 101875251 A | 11/2010 |
| CN | 101937935 A | 1/2011 |
| CN | 101941271 A | 1/2011 |
| CN | 102229266 A | 11/2011 |
| CN | 102234803 A | 11/2011 |
| CN | 102268183 A | 12/2011 |
| EP | 1643546 | 4/2006 |
| EP | 1958763 A1 | 8/2008 |
| EP | 2154203 | 2/2010 |

(56) References Cited

FOREIGN PATENT DOCUMENTS

| | | |
|---|---|---|
| EP | 2221398 | 8/2010 |
| EP | 2426237 | 3/2012 |
| JP | S50-39759 A | 4/1975 |
| JP | 02308555 A | 12/1990 |
| JP | 2004-055248 A | 2/2004 |
| JP | 2005-342895 A | 12/2005 |
| JP | 2006-001216 A | 1/2006 |
| JP | 2006-027018 A | 2/2006 |
| JP | 2008-156381 A | 7/2008 |
| JP | 2010-000679 A | 1/2010 |
| JP | 2010-064496 A | 3/2010 |
| JP | 2012-006392 A | 1/2012 |
| KR | 10-2006-0104540 A | 10/2006 |
| KR | 10-2009-0089852 A | 8/2009 |
| WO | WO 01/38444 A1 | 5/2001 |
| WO | WO 2004/048087 A1 | 6/2004 |
| WO | WO 2009/078377 A1 | 6/2009 |
| WO | WO 2010/073636 A1 | 7/2010 |
| WO | WO 2011/055757 A1 | 5/2011 |
| WO | WO 2011/071102 A1 | 6/2011 |
| WO | WO 2011/123790 A1 | 10/2011 |
| WO | WO 2013/123754 A1 | 8/2013 |
| WO | WO 2013/123756 A1 | 8/2013 |
| WO | WO 2013/123769 A1 | 8/2013 |
| WO | WO 2013/123770 A1 | 8/2013 |
| WO | WO 2013/123771 A1 | 8/2013 |
| WO | WO 2013/123772 A1 | 8/2013 |
| WO | WO 2013/123773 A1 | 8/2013 |
| WO | WO 2013/123898 A1 | 8/2013 |
| WO | 2013148476 | 10/2013 |
| WO | 2013178057 | 12/2013 |
| WO | 2014101778 | 7/2014 |

OTHER PUBLICATIONS

Furneaux et al., "The formation of controlled-porosity membranes from anodically oxidized aluminum", Nature, vol. 337, No. 6203, Jan. 12, 1989, pp. 147-149.
Gong et al., "Electrochemical/chemical synthesis of nanostructured arrays of oxide cones or rings", Journal of Materials Chemistry, vol. 18, No. 15, Mar. 12, 2008, pp. 1741-1746.
Lee et al., "Nanostructure-Dependent Water-Droplet Adhesiveness Change in Superhydrophobic Anodic Aluminum Oxide Surfaces: From Highly Adhesive to Self-Cleanable", Langmuir Letter, vol. 26, No. 3, Feb. 2, 2010, pp. 1412-1415, including Supporting Information, Dec. 29, 2009.
Extended European Search Report dated Sep. 25, 2015, issued in related European Patent Application No. EP12869214.2 (10 pages).
PCT International Search Report dated Nov. 29, 2012, issued in International Application No. PCT/CN2012/078830 (4 pages).
PCT International Search Report dated Dec. 13, 2012, issued in International Application No. PCT/CN2012/078832 (4 pages).
PCT International Search Report dated Jan. 3, 2013, issued in International Application No. PCT/CN2012/082025 (4 pages).
PCT International Search Report dated Jan. 3, 2013, issued in International Application No. PCT/CN2012/082029 (4 pages).
PCT International Search Report dated Jan. 3, 2013, issued in International Application No. PCT/CN2012/082031 (4 pages).
PCT International Search Report dated Jan. 3, 2013, issued in International Application No. PCT/CN2012/082036 (4 pages).
PCT International Search Report dated Jan. 10, 2013, issued in International Application No. PCT/CN2012/082043 (4 pages).
PCT International Search Report dated May 30, 2013, issued in International Application No. PCT/CN2013/071797 (4 pages).
PCT International Search Report and Written Opinion dated Sep. 5, 2013, issued in related International Application No. PCT/CN2013/076351 (12 pages).
PCT International Search Report and Written Opinion dated Mar. 27, 2014, issued in related International Application No. PCT/CN2013/090471 (13 pages).
PCT International Preliminary Report on Patentability dated Aug. 26, 2014, issued in related International Application No. PCT/CN2012/078830 (5 pages).
PCT International Preliminary Report on Patentability dated Aug. 26, 2014, issued in related International Application No. PCT/CN2012/078832 (5 pages).
PCT International Preliminary Report on Patentability dated Aug. 26, 2014, issued in related International Application No. PCT/CN2012/082025 (5 pages).
PCT International Preliminary Report on Patentability dated Aug. 26, 2014, issued in related International Application No. PCT/CN2012/082029 (5 pages).
PCT International Preliminary Report on Patentability dated Aug. 26, 2014, issued in related International Application No. PCT/CN2012/082043 (5 pages).
PCT International Preliminary Report on Patentability dated Aug. 26, 2014, issued in related International Application No. PCT/CN2013/071797 (7 pages).
PCT International Preliminary Report on Patentability dated Aug. 26, 2014, issued in related International Application No. PCT/CN2012/082031 (5 pages).
Extended European Search Report dated Sep. 25, 2015, issued in related European Patent Application No. EP 12869418.9 (7 pages).
Extended European Search Report dated Sep. 25, 2015, issued in related European Patent Application No. EP12869214.2 (6 pages).
Non-Final Office Action dated Feb. 18, 2016, issued in related U.S. Appl. No. 14/466,927 (15 pages).
Non-Final Office Action dated May 24, 2016, issued in related U.S. Appl. No. 14/466,906 (11 pages).
Final Office Action dated Jun. 20, 2016, issued in related U.S. Appl. No. 14/466,932 (10 pages).
Final Office Action dated Jul. 21, 2016, issued in related U.S. Appl. No. 14/466,927 (13 pages).
Non-Final Office Action dated Aug. 1, 2016, issued in related U.S. Appl. No. 14/466,920 (12 pages).
Non-Final Office Action dated Aug. 17, 2016, issued in related U.S. Appl. No. 14/466,873 (15 pages).
Final Office Action dated Nov. 9, 2016, issued in related U.S. Appl. No. 14/466,906 (13 pages).
Final Office Action for U.S. Appl. No. 14/466,927, dated Jul. 17, 2017, 21 pages.
Non-Final Office Action for U.S. Appl. No. 15/184,826, dated Nov. 2, 2017, 8 pages.
Final Office Action for U.S. Appl. No. 14/723,344, dated Dec. 6, 2017, 16 pages.
Lefebvre, L. et al., "Porous Metals and Metallic Foams: Current Status and Recent Developments," Advanced Engineering Materials, 2008, vol. 10, No. 9, p. 775-787.

\* cited by examiner

SHELL, METHOD OF PREPARING THE SHELL AND ELECTRONIC PRODUCT COMPRISING THE SHELL

CROSS-REFERENCE TO RELATED APPLICATION

This application is a continuation application of International Application No. PCT/CN2012/082029, filed on Sep. 26, 2012, which claims priority to and benefits of Chinese Patent Application Serial No. 201210043628.0, filed with the State Intellectual Property Office of P. R. China on Feb. 24, 2012. The entire content of the above referenced applications is incorporated herein by reference.

FIELD

The present disclosure relates to the field of metal-plastic molding, and more particularly to a shell, a method of preparing the shell and an electronic product comprising the shell.

BACKGROUND

Electronic products with a special texture on the outside become very competitive in market. Such electronic products usually have metal shells that can bring excellent visual impact, at the same time have advantages of delicate feel, wear-resist, impact-resist, and corrosion resist and the like.

The existing method of preparing a shell comprising metal and plastic generally uses an adhesive to integrally join the metal and the plastics. However, the mobile phone shell obtained by such a method has poor connection between the metal and the plastic, with poor wear-resist and impact-resist capabilities. The adhesive may also have poor performances of acid-resist and alkali-resist, and the obtained mobile phone shell cannot be subjected to surface treatment such as anodic oxidizing.

SUMMARY

Embodiments of the present disclosure seek to solve at least one of the problems existing in the prior art. The present disclosure also aims to provide a shell and a method of preparing the shell. The shell may have strong adhesion force between the metal and plastic, and the shell may have advantages of wear-resist, impact-resist, and corrosion resist and the like.

According to a first aspect of the present disclosure, a shell for a product, for example, an electronic product, is provided. The shell includes a metal shell body, a plastic part made of a resin, and an oxide layer formed between the metal body and the plastic part, joining the plastic part to the metal shell body. The oxide layer contains corrosion pores having an average diameter of about 200 nm to about 2000 nm on the surface contacting the plastic part, and nanopores having an average diameter of about 10 to 100 nm on the surface contacting the metal shell body. A part of the resin is filled into the nanopores and corrosion pores.

According to a second aspect of the present disclosure, a method for preparing the shell is provided. According to some embodiments of present disclosure, the method may comprise: S1: anodizing at least a part of a surface of a metal shell body to form an oxide layer, wherein the oxide layer is formed with nanopores; S2: immersing the resulting metal shell body in step S1 in an etching solution, to form corrosion pores in at least a part of the outer surface of the oxide layer; and S3: injection molding a resin onto at least a part of the resulting metal shell body in step S2 to obtain the shell, in which the resin is molded to form a plastic part.

According to a third aspect of the present disclosure, an electronic product comprising a shell described above or made by the process described above is provided.

The present disclosure provides a unique two-layer spatial pore structure in the oxide layer formed on the surface of metal shell body. By means of the method according to the embodiments of present disclosure, an oxide layer may be formed on the surface of the metal shell body and the oxide layer may possess nanopores. By means of the technical solutions according to the embodiments of present disclosure, nanopores having an average diameter of about 10 to about 100 nm may be formed, which provides a strong connection force with resin. Meanwhile, by means of further corrosion treatment, corrosion pores may be formed on the outer surface of the oxide layer, to be contacted with a resin. The corrosion pores may have a larger average diameter than nanopores. By means of the technical solutions according to the embodiments of present disclosure, corrosion pores having an average diameter of about 200 nm to about 2000 nm may be formed on the outer surface of the oxide layer, which, with the injected resin, enhances the connection force of the resin with the metal shell body. The obtained shell may have desired performances of wear-resist and impact-resist. In the course of molding, the resin may penetrate into the pores in the inner layer through the relative bigger pores on the outer surface of metal shell, which will make molding easier. The metal shell body may be joined to the plastic part tightly without additional bonding, and a higher strength may be obtained, improving the anti-corrosion performance. According to the embodiments of present disclosure, there is less impact on the size of metal shell body and the appearance of metal shell body, and relatively less heat is produced in the process. Meanwhile, resin may be easily injection molded into the corrosion pores with larger diameter on the surface, and there is no particular requirement on the resin. The present technical solution has wide and various applications, is environment-friendly, and may be adopted for massive production.

Additional aspects and advantages of the embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
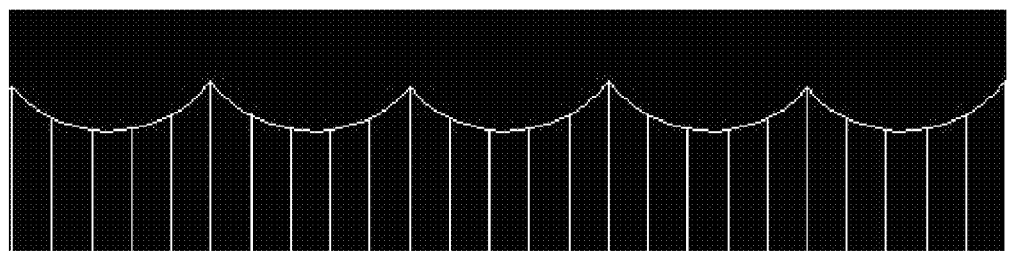
FIG. 1 shows the presence of a two-layer spatial pore structure in an oxide layer prepared in accordance with one embodiment of present disclosure.

Reference will be made in detail to embodiments of the present disclosure. The embodiments described herein are explanatory, illustrative, and used to generally understand the present disclosure. The embodiments shall not be construed to limit the present disclosure.

According to a first aspect of the present disclosure, a shell for a product, for example, an electronic product, is provided. According to embodiments of present disclosure, the shell may comprise a plastic part, a metal shell body, and an oxide layer formed between the metal body and the plastic part. According to embodiments of present disclosure, the plastic part may be made of a resin, and the oxide layer may join the plastic part to the metal shell body. According to embodiments of present disclosure, the oxide layer contains corrosion pores having an average diameter of about 200 nm to about 2000 nm on the surface contacting the plastic part, and nanopores having an average diameter of about 10 to 100 nm in the surface contacting the metal shell body. According to the embodiments of present disclosure, a part of the resin is filled into the corrosion pores and the nanopores. The connection force between metal shell body and plastic is enhanced by the oxide layer with the corrosion pores and nanopores. Thus, the shell may be wear-resist, impact-resist, and corrosion-resist.

According to an embodiment of present disclosure, the corrosion pores may have an average diameter of about 200 nm to about 1000 nm. According to a further embodiment, the corrosion pores may have an average diameter of about 400 nm to about 1000 nm. According to a still further embodiment, the nanopores may have an average diameter of about 20 nm to about 80 nm. According to a still further embodiment, the nanopores may have an average diameter of about 20 nm to about 60 nm. The structure of the two-layered pores may improve the direct injection of resin when molding and further improve the joining of resin with the metal sheet body.

According to an embodiment of present disclosure, the corrosion pores may have an average depth of about 0.5 μm to about 9.5 μm. According to another embodiment, the corrosion pores may have an average depth of about 0.5 μm to 5 μm. The structure of the corrosion pores may improve the penetration of the injected resin.

According to embodiments of present disclosure, the corrosion pores may be in communication with the nanopores. The structure of the two-layered pores may be further optimized, and further contribute to the direct injection of resin and molding, improving the joining of resin with the metal sheet body.

According to embodiments of present disclosure, the oxide layer may have a thickness of about 1 μm to about 10 μm, preferably about 1 μm to about 5 μm. In these embodiments, the oxide layer may have an improved adhesion with the metal sheet body, such as an aluminum alloy body.

According to embodiments of present disclosure, the nanopores may have an average depth of about 0.5 μm to about 9.5 μm, preferably about 0.5 μm to 5 μm. In these embodiments, the structure of the nanopores may be further optimized, and the degree of filling of melt resin in the nanopores may be improved, ensuring that the resin may penetrate into nanopores with depth, decreasing the connection area between resin and oxide layer, eliminating gaps or voids in the nanopores, and enhancing the connection force between the resin and the metal sheet body.

According to embodiments of present disclosure and as described below, the plastic part can be used as any parts of the shell.

Figure 5:
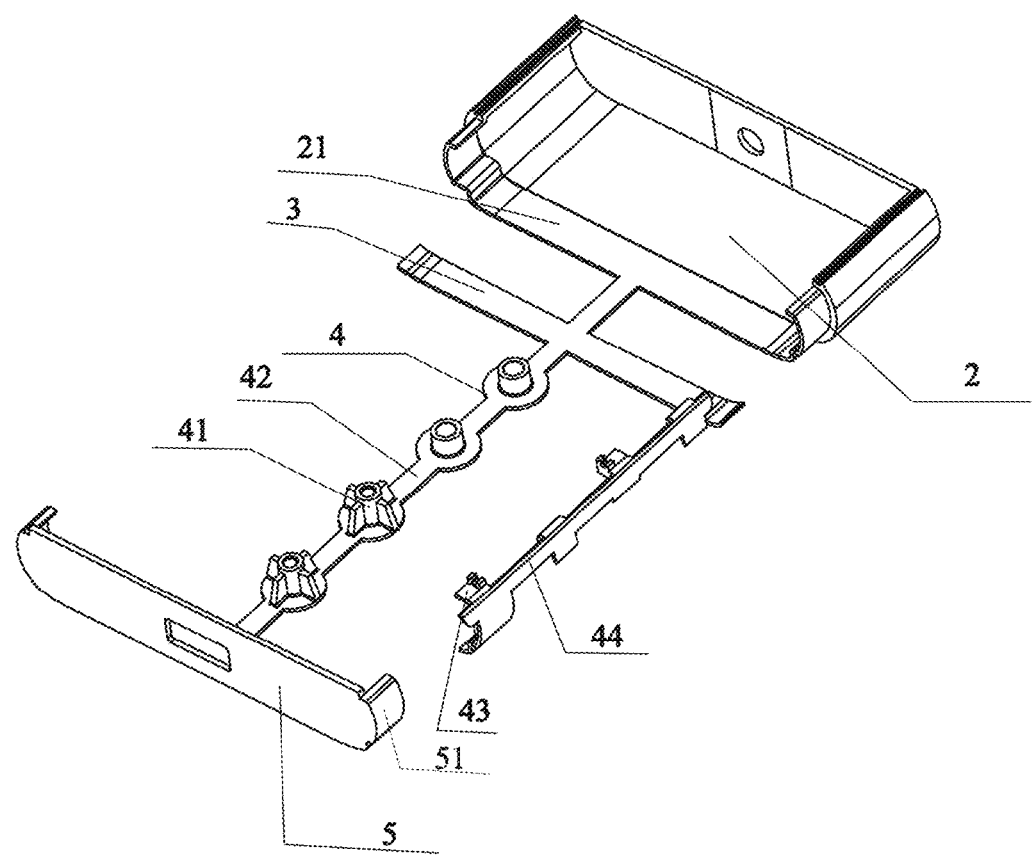
FIG. 5 shows a schematic diagram of a plastic part of a mobile phone shell according to one embodiment of present disclosure.

According to embodiments of present disclosure, referring to FIG. 5 the plastic part may comprise a plastic shell body 2 having a shape similar to that of the metal shell body 1. A space may be defined by the plastic shell body 2 to accommodate other parts for example a display screen or an antenna for a cell phone. The plastic shell body 2 may be provided on an end of the metal shell body 1. The oxide layer is formed between the plastic shell body 2 and the end of the metal shell body 1. The oxide layer may join the plastic shell body 2 to the end of the metal shell body 1. According to some embodiments of present disclosure, the plastic shell 2 may be provided on one or two end of the metal shell body 1, depending on specific desired needs. According to some embodiments of present disclosure, the plastic shell body 2 may match with the metal shell body 1. In other words, the plastic shell body 2 may form a whole shell shape together with the metal shell 1. According to some embodiments of present disclosure, the plastic shell body 2 is joined to the metal shell body 1's one end, and an oxide layer made of a metal oxide may be provided between the metal shell body 1 and the plastic shell body 2. The plastic shell body 2 may be joined to the metal shell body 1 via the oxide layer. According to some embodiments of present disclosure, a part of the resin forming the plastic shell body may be filled into the nanopores and corrosion pores, resulting in an integral combination of plastic shell body and metal shell body. According to embodiments of present disclosure, the area of a surface joining the plastic shell body to the metal shell body is not limited. In one embodiment of present disclosure, the width of the surface joining the plastic shell and the metal shell body is about 0.5 mm to about 2 mm, which is relative small, thus a stronger joining force is required.

According to some embodiments of present disclosure, the plastic part may further comprise a strengthening rib 51 made of a resin and the strengthening rib 51 may extend along the inner surface of the metal shell body and is joined to the inner surface of the metal shell body. According to some embodiments of present disclosure, the oxide layer may be formed between the strengthening rib 51 and the inner surface of the metal shell body 1, and the resin forming the strengthening rib may be filled into the corrosion pores and corrosion pores of the oxide layer. Thus the connection force between the plastic shell and metal shell body is further enhanced, and then shell obtained may have an enhanced impact-resist.

According to some embodiments of present disclosure, the plastic part may comprise a plastic patch 3 provided in the inner surface of the metal shell body 1, and the plastic patch 3 is joined to the inner surface of the metal shell body 1. According to some embodiments of present disclosure, the oxide layer is formed between the plastic patch 3 and the inner surface of the metal shell body 1, and may join the plastic patch 3 to the inner surface of the metal shell body 1, and the resin forming the plastic patch 3 is filled into the nanopores and the corrosion pores of the oxide layer. According to some embodiments of present disclosure, the shape and size of the plastic patch 3 is not specially limited. For example, the plastic patch may be used as a support of antenna. For the purpose of saving space, the plastic patch may be in a form of a sheet, and located on the inner surface of the metal shell body, adhering to and contacting the surface of the metal shell body. The plastic patch 3 may be used to mount a WIFI antenna. Thus, for a purpose of avoiding signaling being shielded by metal, an opening for signaling is provided in the surface joining the plastic patch 3 to metal shell body 1. The size and shape of the opening is not specially limited in the present disclosure For example the opening may be a small slit located in such a way that a part of the plastic patch 3 is exposed.

According to some embodiments of present disclosure, the plastic part may comprise a plastic support provided in the inner surface of the metal shell body 1, and the plastic support is joined to the inner surface of the metal shell body 1. According to some embodiments of present disclosure, the oxide layer is formed between the plastic support and the inner surface of the metal shell body 1, joining the plastic support to the inner surface of the metal shell body 1. According to some embodiments of present disclosure, the resin forming the plastic support is filled into the nanopores and corrosion pores of the oxide layer. The structure and function of the support made of resin may be designed depending on desired needs. According to some embodiments of present disclosure, the plastic support further comprises a buckle and a mounting hole. In one embodiment of present disclosure, the mounting hole may be a screw hole. According to some embodiments of present disclosure, the plastic support may be used to accommodate other parts, for example parts of a mobile phone, to firmly mount the components within the space of the shell, thus resulting a performances of firm mounting, wear-resisting, impact-resisting, appealing appearance, and easiness to assemble.

According to some embodiments of present disclosure, the plastic part comprises a plastic basal plate 5 provided on an end of the metal shell body. According to embodiments of present disclosure, the plastic basal plate is positioned perpendicular to the metal shell body 1, and an edge of the plastic basal plate is joined to the inner surface or the end of the metal shell body 1. According to some embodiments of present disclosure, the oxide layer is formed between the plastic basal plate and the inner surface or the end of the metal shell body 1, joining the plastic basal plate to the inner surface or the end of the metal shell body 1. According to some embodiments of present disclosure, the resin forming the plastic basal plate is filled into the nanopores and corrosion pores of the oxide layer. According to some embodiments of present disclosure, the plastic plate may be used to mount GPRS, Bluetooth, and/or infrared antenna.

According to some embodiments of present disclosure, the plastic part may comprise at least one of the above described plastic shell body, plastic support, plastic patch to mount an antenna, depending on the desired needs. The assembling of the antenna is not specially limited, and a person skilled in the art may attach the antenna in a shape of a sheet to the plastic part, or form an antenna through chemical plating.

According to some embodiments of present disclosure, the plastic part comprises: a plastic shell body, a plastic support, a plastic patch provided on the plastic support, and a plastic basal plate. According to some embodiments of present disclosure, the plastic shell body is connected with the plastic basal plate via the plastic support, and the plastic shell, the plastic support, the plastic patch and the plastic basal plate are integrally formed.

According to a second aspect of the present disclosure, a method of preparing an aluminum alloy described above is provided. The method comprises steps of:

S1: anodizing at least a part of the surface of a metal shell body to form an oxide layer, wherein the oxide layer is formed with nanopores.

According to some embodiments of present disclosure, in this step, at least a part of the surface of a metal shell body, which is made from aluminum alloy, optionally pre-treated prior to step S1, may be subjected to an anodization treatment to form an oxide layer on the part of the surface of the aluminum alloy, and the oxide layer may be formed with nanopores. The anodization treatment of aluminum alloy may use a method that is well known to the skilled person in the art. According to some embodiments of present disclosure, the step S1, namely the anodization treatment may comprise: placing the part of the surface of the metal shell body, optionally pre-treated prior to this step, as an anode in a $H_2SO_4$ solution with a concentration of about 10 wt % to about 30 wt %; and electrolyzing the part of the surface of the metal shell body at a temperature of about 10° C. to about 30° C., at a voltage of about 10V to about 100V for about 1 min to about 40 min, to form the oxide layer with a thickness of about 1 μm to about 10 μm. According to some embodiments of present disclosure, the anodization treatment may use traditional equipment, for example, according to an embodiment of present disclosure, an anodization tank. According to some embodiments of present disclosure, the oxide layer formed by means of anodization treatment may have a preferred thickness of about 1 μm to about 10 μm, preferably about 1 μm to about 5 μm. According to some embodiments of present disclosure, the nanopores of the oxide layer may have an average diameter of about 10 nm to about 100 nm, preferably about 20 nm to about 80 nm, and further preferred about 20 nm to about 60 nm. According to some embodiments of present disclosure, the nanopores may have a depth of about 0.5 μm to about 9.5 μm, preferably about 0.5 μm to about 5 μm. With the nanopores, the connection force between the oxide layer and the resin is increased.

According to some embodiments of present disclosure, the part of the surface of the metal shell body to be subjected to anodization treatment may be any parts to be joined to a plastic part. According to some embodiments of present disclosure, the plastic part comprises a plastic shell body, and the part of the surface of the metal shell body to be subjected to the anodization treatment may be at least a part of an end of the metal shell body. According to some embodiments of present disclosure, the plastic part comprises a plastic support, and the part of the surface of the metal shell body to be subjected to anodization may be at least a part of the inner surface of the metal shell body. According to some embodiments of present disclosure, the plastic part comprises a plastic patch, and the part of the surface of the metal shell body to be subjected to the anodization treatment may be at least a part of the inner surface of the metal shell body. According to some embodiments of present disclosure, the plastic part comprises a plastic basal plate, and the part of the surface of the metal shell body to be subjected to the anodization treatment may be at least a part of the inner surface or the end of the metal shell body and the surface around thereof. According to one embodiment of present disclosure, the whole metal shell body may be subjected to the anodization treatment to form an oxide layer on the surface of the metal shell body, and the oxide layer formed may comprise nanopores having an average diameter of about 10 nm to about 100 nm. It should be noted the formed nanopores will have no adverse influence on the appearance of the resulting shell, because these pores may be easily removed, for example removed by furnishing treatment.

S2: immersing the resulting metal shell body in step S1 in an etching solution, to form corrosion pores in at least a part of the outer surface of the oxide layer.

According to some embodiments of present disclosure, in this step, the resulting metal shell body in step S1 may be immersed in an etching solution thus corrosion pores with a diameter of about 200 nm to about 2000 nm may be formed in the outer surface of the oxide layer formed on the aluminum alloy substrate in step S1.

In this step, an etching solution is used to treat the resulting aluminum alloy substrate in step S1, and then corrosion pores may be formed in an outer surface of the oxide layer. The size of corrosion pores is usually larger than that of nanopores. The type and concentration of the etching solution is not specially limited, as long as the etching solution is a solution being corrosive to the oxide layer. According to some embodiments of present disclosure, the etching solution is an acid/alkaline etching solution with a pH of about 10 to about 13. According to some embodiments of present disclosure, the etching solution may be an alkaline solution with a pH of about 10 to about 13 of sole alkali or mixture of several alkalis. According to some embodiments of present disclosure, the etching solution may comprise an aqueous solution containing at least one selected from a group consisting of $Na_2CO_3$, $NaHCO_3$, $NaOH$, $NaH_2PO_4$, $Na_2HPO_4$, $Na_3PO_4$, $Na_2SO_3$ or $Na_2B_4O_7$. According to some embodiments of present disclosure, the alkaline solution is an aqueous solution containing $Na_2CO_3$ and/or $NaHCO_3$. According to some embodiments of present disclosure, in the alkaline solution, $Na_2CO_3$ and/or $NaHCO_3$ have a mass percent concentration of about 0.1 wt %-15 wt % respectively. According to some embodiments of present disclosure, in the alkaline solution, $Na_2CO_3$ and/or $NaHCO_3$ have a mass percent concentration of about 0.1 wt %-10 wt % respectively. According to some embodiments of present disclosure, the etching solution may be a mixture of a soluble alkali with a soluble hydrophosphate or dihydrogen phosphate. According to some embodiments of present disclosure, the soluble alkali may be a strong alkali. According to some embodiments of present disclosure, the dihydrogen phosphate is at least one selected from a group consisting of sodium dihydrogen phosphate, potassium dihydrogen phosphate, ammonium dihydrogen phosphate, and aluminum dihydrogen phosphate, and the soluble alkali is at least one selected from a group consisting of sodium hydroxide and potassium hydroxide. With the preferred combination of dihydrogen phosphate and alkali, the corrosion pores formed are distributed evenly on the surface of oxide layer with uniform diameters, enabling a better connection force performance of the resin layer with the aluminum alloy substrate, resulting in a better tensile strength and a better integral joining of the aluminum alloy-resin composite. According to an embodiment of present disclosure, the dihydrogen phosphate has a concentration of about 50 wt % to about 99 wt %, and the soluble alkali has a concentration of about 1 wt % to about 50 wt %, and more preferably, the dihydrogen phosphate has a concentration of about 60 wt % to about 99 wt %, and the soluble alkali has a concentration of about 1 wt % to about 40 wt %. Further, the etching solution may be at least one of ammonia solution, hydrazine aqueous solution, hydrazine derivatives aqueous solution, water-soluble amine compound aqueous solution and $NH_3$—$NH_4Cl$ aqueous solution and the like. According to an embodiment of present disclosure, step S2 may comprise repeatedly immersing the aluminum alloy resulted from step S1 in an alkaline solution having a pH of about 10 to about 13 for a plurality of times, namely more than one time, for example for about 2-10 times, each immersing lasting for about 1 min to about 60 min, and cleaning the aluminum alloy with water after each immersing, for example washing with de-ionized water. According to an embodiment of present disclosure, the cleaning may comprise placing the part to be cleaned in a washing tank and stand for about 1 min to 5 min, or may comprise washing the part to be cleaned in a washing tank for about 1 min to 5 min.

S3: injection molding a resin onto at least a part of the resulting metal shell body in step S2 to obtain the shell, in which the resin is molded into a plastic part.

According to some embodiments of present disclosure, in this step, the resulting metal shell body after the treatments in steps S1 and S2 may be placed in a mold, and a resin composition may be injected into the mold to combine with the metal shell body, and thus a shell is produced after the molding treatment.

According to some embodiments of present disclosure, after injection molding, the resulting shell may be further subjected to annealing under a temperature of about 50° C. to about 200° C. According to some embodiments of present disclosure, the annealing may comprise keeping the resulting shell after injection molding under a temperature of about 50° C. to about 200° C. for about 1 to 2 hours, and then decreasing the temperature. For example, the resulting shell may be kept at about 70° C. to about 180° C. for about 1 to 1.5 hours, and then the temperature is decreased. The annealing apparatus may be any well-known equipment by the person skilled in the art. For example, the resulting shell may be kept in an Electric Thermostatic Drying Oven, and a Multistage heating furnace may also be applied. According to some embodiments of present disclosure, the resulting shell may be placed in an annealing apparatus at a temperature of about 50° C. to about 200° C. directly, or the temperature of about 50° C. to about 200° C. may be reached gradually, for example at a rate of 1-10° C./min. The temperature may be decreased to room temperature, for example 15~28° C., which may be reached naturally or gradually, for example at a rate of about 1-10° C./min, and preferably 3-8° C./min. Thus, the solid resin may be transformed into liquid phase, and penetrate into the nanopores, and thus the connection force between the metal shell body and plastic part will be further enhanced.

As mentioned above, prior to the treatment of step S1, the metal shell body may be subjected to a pretreatment, which generally comprises mechanical burnishing or mechanical lapping to remove visible foreign matters from the surface, and degreasing and washing the metal shell body to remove processing oil adhered to the metal surface. Preferably, pretreatment comprises burnishing the surface of the metal shell body, for example burnishing the surface of the metal shell body using a sand paper of about 100 mesh to about 400 mesh or using a polishing machine, to create small pores of microns. According to some embodiments of present disclosure, the burnished metal shell body may be sequentially subjected to oil removing, a first washing with water, alkali etching, a second washing with water, neutralizing, and a third washing with water. According to some embodiments of present disclosure, the metal shell body may be cleaned by means of ultrasonic wave using any well-known solvent for about 0.5 hour to about 2 hours to remove oily dirty from the surface of metal shell body, and then placed in an acid/alkali aqueous solution. The surface of the metal shell body may be washed again under ultrasonic wave. The types of the solvents and acid/alkali aqueous solution are not limited. The solvent may include ethanol or acetone, and the acid/alkali aqueous solution may be at least one selected from a group consisting of hydrochloric acid, sulphuric acid, sodium hydroxide, potassium hydroxide and the like. According to some embodiments of present disclosure, the metal shell body is subjected to oil removing treatment using water-free ethanol to remove oil from the surface, and then washing the metal shell body using water. Then, the washed metal shell body is immersed in a sodium hydroxide solution at a concentration of about 30-70 g/L and at a temperature of about 40° C. to about 80° C. to alkali etch the aluminum alloy for about 1-5 min, and washed using deionized water. Then, the metal shell body is neutralized using a 10~30 wt % $HNO_3$ to remove trace alkali solution, and washed using deionized water. Thus, pores with a size of microns may be formed in the surface of metal shell body. According to some embodiments of present disclosure, the diameter may be about 1-10 μm.

There are no special limitations to the materials of the metal shell body used in present disclosure, and the examples may be aluminum alloy of Industry-Standard 1000-7000 series, or various metal shell body of molded-class. The metal shell body in this disclosure may be commonly-used metal shell body with various shapes and structures. The various shapes and structures of the metal shell body may be achieved by mechanical processing.

According to some embodiments of present disclosure, the resin used in present disclosure may be prepared by mixing a main resin and a polyolefin resin. For example, the resin is prepared by mixing evenly a main resin and a polyolefin resin, and then granulation with a machine with twin stirring screws. According to some embodiments of present disclosure, a flow improver and a filler may be added to the main resin and mixed evenly. Thus, the obtained resin has a linear expansion coefficient similar to the aluminum alloy both in horizontal and vertical direction.

According to some embodiments of present disclosure, the conditions to carry out the injection molding are not limited. For example, according to one embodiment of present disclosure, the condition of injection molding may be: mold temperature 50 to 300° C., nozzle temperature 200-450° C., pressure maintaining time 1-50 s, injection pressure 50-300 MPa, injection time 1-30 s, delay time 1-30 s, and cooling time 1-60 s. According to one embodiment of present disclosure, the condition of injection molding may be: mold temperature 80 to 200° C., nozzle temperature 200-350° C., pressure maintaining time 1-10 s, injection pressure 90-140 MPa, injection time 3-10 s, delay time 15-30 s, and cooling time 15-25 s. In these embodiments, the surface of the prepared composite may have a resin layer with a depth of 0.5-10 mm.

The preparation method of the present disclosure is simple, which simplifies significantly the production process when compared with existing adhesive technology, and shortens the corrosion time compared with the existing amine substance, thus shortening the production time and significantly reducing the process's complexity. All above may be achieved only by directly injection molding after using the method of the present disclosure. At the same time, the prepared aluminum alloy resin composite by the preparation method of the present disclosure has a combination of the resin layer and the aluminum alloy substrate, and has better tensile shear strength.

There is no special limitation to the resin used in present invention, which may be any resin capable of joining with aluminum alloy, in which thermoplastic resin is preferred. According to some embodiments of present disclosure, the thermoplastic resin is a mixture of a main resin and a polyolefin resin. According to some embodiments of present disclosure, the main resin may be non-crystalline resin, which has a surface gloss and a toughness both superior to those of the highly crystalline resins in the prior art, is used as an injection molding material, and a polyolefin resin with a melting point of about 65° C. to about 105° C. is also used. Therefore, injection molding at a specific mound temperature may not be required during the molding, subsequent annealing treatment may also not be required, the molding process may be simplified, and it may be ensured that the obtained metal-resin composite structure may have high mechanical strength and good surface treatment characteristics, thus solving the problem of the surface decoration of a plastic part and meeting the diverse requirements of customers.

According to some embodiments of present disclosure, it has been found by the inventors through many experiments that in the present disclosure, by using a polyolefin resin with a melting point of about 65° C. to about 105° C. in the non-crystalline main resin, the flowing capability of the resin in the nanoscale micropores on the surface of the metal sheet may be enhanced, thus ensuring strong adhesive force between the metal and the plastic as well as a high mechanical strength of the metal-resin composite structure. Preferably, based on 100 weight parts of the thermoplastic resin, the amount of the main resin is about 70 weight parts to about 95 weight parts, and the amount of the polyolefin resin is about 5 weight parts to about 30 weight parts.

It has also been found by the inventors that the flowing capability of the resin may be enhanced by using a flow improver in the thermoplastic resin, thus further enhancing the adhesive force between the metal and the plastic as well as the injection molding performance of the resin. Preferably, based on 100 weight parts of the thermoplastic resin, the thermoplastic resin further contains about 1 weight part to about 5 weight parts of a flow improver. Preferably, the flow improver is a cyclic polycarbonate.

As mentioned before, the resin used in present disclosure may be non-crystalline resin. According to some embodiments of present disclosure, the main resin is a mixture of polyphenylene ether (PPO) and polyphenylene sulfide (PPS). According to one embodiment of present disclosure, in the main resin, the weight ratio of polyphenylene ether to polyphenylene sulfide is about 3:1 to about 1:3, preferably about 2:1 to about 1:1. According to some embodiments of present disclosure, the main resin is a mixture of polyphenylene oxide and a polyamide. According to one embodiment of present disclosure, in the main resin, the weight ratio of polyphenylene oxide to the polyamide is about 3:1 to about 1:3, preferably about 2:1 to about 1:1. According to some embodiments of present disclosure, in the main resin, the main resin is a polycarbonate, which may be linear chain polycarbonate or branched polycarbonate.

According to some embodiments of present disclosure, the polyolefin resin has a melting point of about 65° C. to about 105° C., and preferably the polyolefin resin may be grafted polyethylene. Preferably, a grafted polyethylene with a melting point of about 100° C. to about 105° C. may be used as the polyolefin resin.

The resin used in present disclosure may further comprise other modifier additives, and there is no special limitation to the additives. For example, the resin may comprise a filler. There is no special limitation to the filler. The non-limiting example of the filler is fiber filler or powder filler. The fiber filler may be at least one selected from a group consisting of fiberglass, carbon fiber and aromatic polyamide fiber. The powder filler may be at least one selected from a group consisting of calcium carbonate, magnesium carbonate, silica, heavy barium sulfate, talcum powder, glass and clay. According to some embodiments of present disclosure, based on 100 weight parts of the main resin, the content of the fiber filler is 50-150 weight parts and the content of the powder filler is 50-150 weight parts. The resulted resin has a linear expansion coefficient similar to the aluminum alloy both in horizontal and vertical direction.

According to some embodiments of present disclosure, the resin used in present disclosure may be prepared by mixing the main resin and the polyolefin resin. For example, the resin is prepared by mixing evenly a main resin and a polyolefin resin, and then granulation with twin-screw extruding machine. According to some embodiments of present disclosure, a flow improver and a filler may be added to the main resin and mixed evenly, thus the obtained resin has a linear expansion coefficient similar to the metal shell body both in horizontal and vertical direction.

According to some embodiments of present disclosure, the conditions to carry out the injection molding are not limited. For example, according to one embodiment of present disclosure, the condition of injection molding may be: mold temperature 50 to 300° C., nozzle temperature 200-450° C., pressure maintaining time 1-50 s, injection pressure 50-300 MPa, injection time 1-30 s, delay time 1-30 s, and cooling time 1-60 s. According to one embodiment of present disclosure, the condition of injection molding may be: mold temperature 80 to 200° C., nozzle temperature 200-350° C., pressure maintaining time 1-10 s, injection pressure 90-140 MPa, injection time 3-10 s, delay time 15-30 s, and cooling time 15-25 s. Then the surface of the prepared shell may have a resin layer with a depth of 0.5-10 mm.

The preparation method of the present disclosure is simple, which simplifies significantly the production process when compared with existing adhesive technology, and shortens the corrosion time when compared with the existing amine substance, thus shortens the production time, and significantly reduces the process complexity. All above may be achieved only by directly injection molding after using the process method of the present disclosure. At the same time, the prepared shell by the preparation method of the present disclosure has a better combination between the resin layer and the metal shell body, and has better tensile shear strength.

There is no special limitation to the resin used in present invention, which may include any resin capable of joining with metal shell body, in which thermoplastic resin is preferred. According to some embodiments of present disclosure, the thermoplastic resin includes a mixture of a main resin and a polyolefin resin. According to some embodiments of present disclosure, the main resin may include non-crystalline resin, which has a surface gloss and a toughness both superior to those of the highly crystalline resins in the prior art, is used as an injection molding material, and a polyolefin resin with a melting point of about 65° C. to about 105° C. is also used. Therefore, injection molding at a specific mound temperature may be not required during the molding, subsequent annealing treatment may also be not required, the molding process may be simplified, and it may be ensured that the obtained metal-resin composite structure may have high mechanical strength and good surface treatment characteristics, thus solving the problem of the surface decoration of a plastic part and meet the diverse requirements of customers.

According to some embodiments of present disclosure, it has been found by the inventors through many experiments that in the present disclosure, by using a polyolefin resin with a melting point of about 65° C. to about 105° C. in the non-crystalline main resin, the flowing capability of the resin in the nanopores in the surface of the metal sheet may be enhanced, thus ensuring strong adhesive force between the metal and the plastic as well as high mechanical strength of the metal-resin composite structure. Preferably, based on 100 weight parts of the thermoplastic resin, the amount of the main resin is about 70 weight parts to about 95 weight parts, and the amount of the polyolefin resin is about 5 weight parts to about 30 weight parts.

It has also been found by the inventors that by using a flow improver in the thermoplastic resin, the flowing capability of the resin may be enhanced, thus further enhancing the adhesive force between the metal and the plastic as well as the injection molding performance of the resin. Preferably, based on 100 weight parts of the thermoplastic resin, the thermoplastic resin further contains about 1 weight part to about 5 weight parts of a flow improver. Preferably, the flow improver is a cyclic polycarbonate.

As mentioned before, the resin used in present disclosure may be non-crystalline resin. According to some embodiments of present disclosure, the main resin is a mixture of polyphenylene ether (PPO) and polyphenylene sulfide (PPS). According to one embodiment of present disclosure, in the main resin, the weight ratio of polyphenylene ether to polyphenylene sulfide is about 3:1 to about 1:3, preferably about 2:1 to about 1:1. According to some embodiments of present disclosure, the main resin is a mixture of polyphenylene oxide and a polyamide. According to one embodiment of present disclosure, in the main resin, the weight ratio of polyphenylene oxide to the polyamide is about 3:1 to about 1:3, preferably about 2:1 to about 1:1. According to some embodiments of present disclosure, in the main resin, the main resin is a polycarbonate, which may be linear chain polycarbonate or branched polycarbonate.

According to some embodiments of present disclosure, the polyolefin resin has a melting point of about 65° C. to about 105° C., preferably the polyolefin resin may include a grafted polyethylene. Preferably, a grafted polyethylene with a melting point of about 100° C. to about 105° C. may be used as polyolefin resin.

The resin used in present disclosure may further comprise other modifier additives, and there is no special limitation to the additives, for example, the resin may comprise a filler. And there is no special limitation to the filler, and the non-limiting example of the filler is fiber filler or powder filler. The fiber filler may be at least one selected from a group consisting of fiberglass, carbon fiber and aromatic polyamide fiber. And the powder filler may be at least one selected from a group consisting of calcium carbonate, magnesium carbonate, silica, heavy barium sulfate, talcum powder, glass and clay. According to some embodiments of present disclosure, based on 100 weight parts of the main resin, the content of the fiber filler is 50-150 weight parts and the content of the powder filler is 50-150 weight parts. Then the resin has a linear expansion coefficient similar to the metal shell body both in horizontal and vertical direction.

According to some embodiments of present disclosure, the resulting shell after injection molding may be further subjected to finishing treatments. For example, the resulting shell may be subjected to surface burnishing and abrasion blasting, removing the flashes, making the shell brighter, and improving the aesthetic feeling. The burnishing treatment may be carried out using a sand paper of about 100 mesh to about 400 mesh or using a polishing machine. The abrasion blasting may be carried out using a ceramic bead or iron bead of about 100 to about 600 mesh, to form a sandy appearance of the shell.

According to some embodiments of present disclosure, after the surface burnishing and abrasion blasting, the resulting shell may be subjected to surface treatments of anodization and dyeing, so as to form a decorative effect of various colors and improve the characteristics of corrosion-resistance and wear-resistance. It may be also comprise performing other surface decorative treatment of shell surface, such as spraying, electrophoresis, PVD, plating, etc.

According to a third aspect of the present disclosure, there is provided electronic product comprising a shell, wherein the shell is described above. The example of the electronic product may include: cell phone, PDA, computer, and the same.

In order to make the technical problem, the technical solution and the advantageous effects of the present disclosure more clear, the present disclosure will be further described below in detail with reference to examples thereof. It would be appreciated that particular examples described herein are merely used to understand the present disclosure. The examples shall not be construed to limit the present disclosure. The raw materials used in the examples and the comparative examples are all commercially available, without special limits.

EXAMPLE 1

1. Pretreatment

Figure 4:
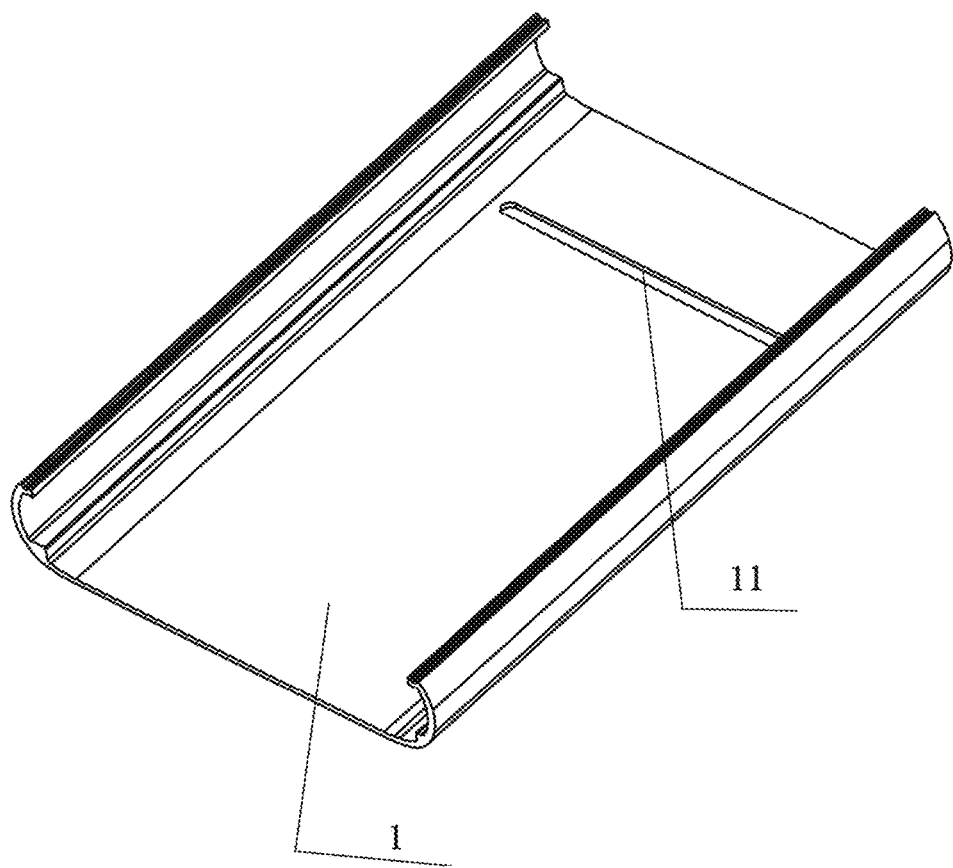
FIG. 4 shows a schematic diagram of a metal shell body of a mobile phone shell according to one embodiment of present disclosure.

A commercially available A5052 aluminum alloy shell body with a thickness of 1 mm was cut into 15 mm×80 mm rectangular shells (as shown in FIG. 4). The shells were then polished in a polishing machine, and cleaned with water-free ethanol, and then immersed in a 40 g/L NaOH aqueous solution. After 2 min, the rectangular shells were washed with water and dried to obtain pretreated aluminum alloy shells.

2. Surface Treatment 1

Each aluminum alloy shell was placed as an anode in an anodizing bath containing a 20 wt % $H_2SO_4$ solution. The aluminum alloy shell was electrolyzed at a voltage of 20V at 18° C. for 10 min, and then was blow-dried.

Figure 2:
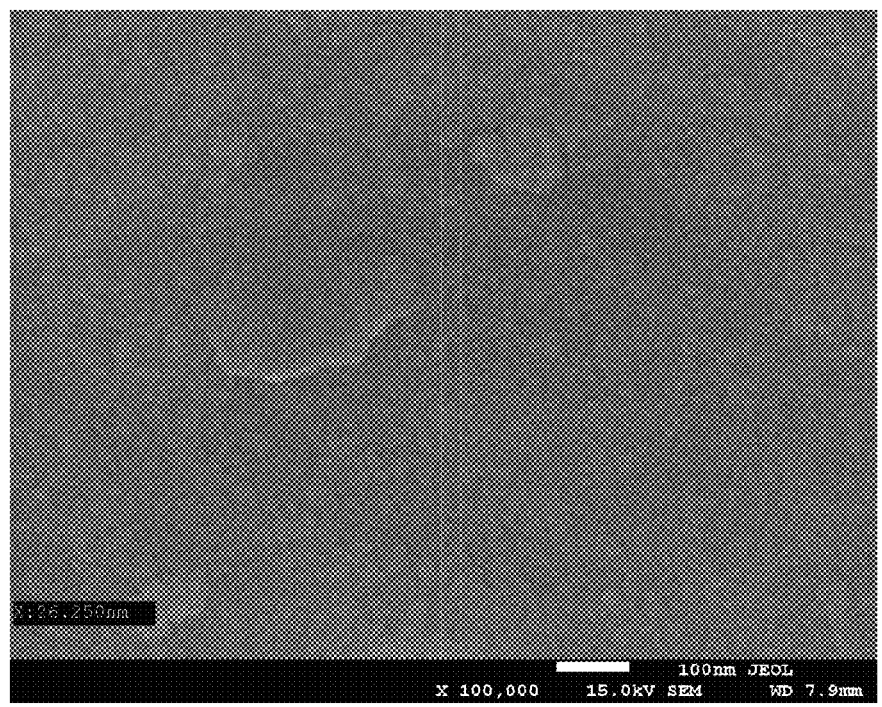
FIG. 2 shows a scanning electron microscopy diagram of an aluminum alloy sheet surface after surface treatment 1 in Example 1.

The cross section of the aluminum alloy shell after the surface treatment 1 was observed by a metalloscope. The observation shows that an aluminum oxide layer with a thickness of 5 μm was formed on the surface of the electrolyzed aluminum alloy shell. The surface of the aluminum alloy shell after the surface treatment 1 was observed by an electron microscope (see FIG. 2), showing that nanopores with an average diameter of about 40 nm to about 60 nm and a depth of 1 μm was formed in the aluminum oxide layer.

3. Surface Treatment 2

Aqueous solution containing 10 wt % $Na_2CO_3$ (pH=12.2) in the amount of 500 ml was prepared in a beaker. The aluminum alloy sheet after step (2) was immersed in the sodium carbonate solution at 20° C., taken out after 5 min, and immersed in a beaker containing water for 1 min. After 5 cycles, after water immersing for the last time, the aluminum alloy shell was blow-dried.

Figure 3A:
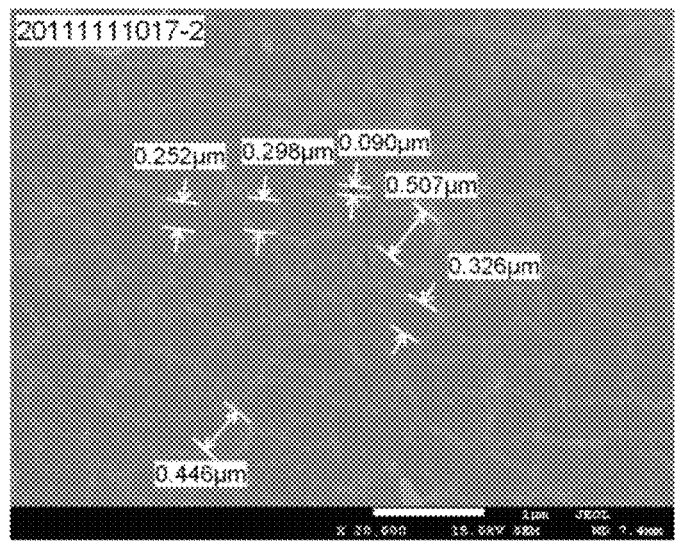
FIGS. 3a and 3b show scanning electron microscopy diagrams of an aluminum alloy sheet surface after surface treatment 2 in Example 1.
Figure 3B:
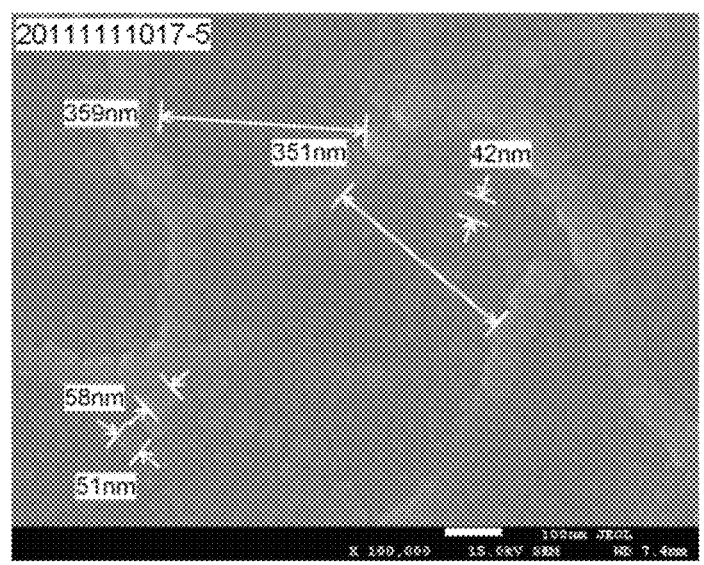

The surface of the aluminum alloy shell after the surface treatment 2 was observed by an electron microscope (see FIGS. 3a and 3b), showing that corrosion pores with an average diameter of 300 nm to 1000 nm and a depth of 4 μm was formed in the surface of the immersed aluminum alloy shell. It may also be observed that there was a double-layer three-dimensional pore structure in the aluminum oxide layer similar to the structure shown in FIG. 1, and the corrosion pores were in communication with the nanopores.

4. Molding

Figure 6:
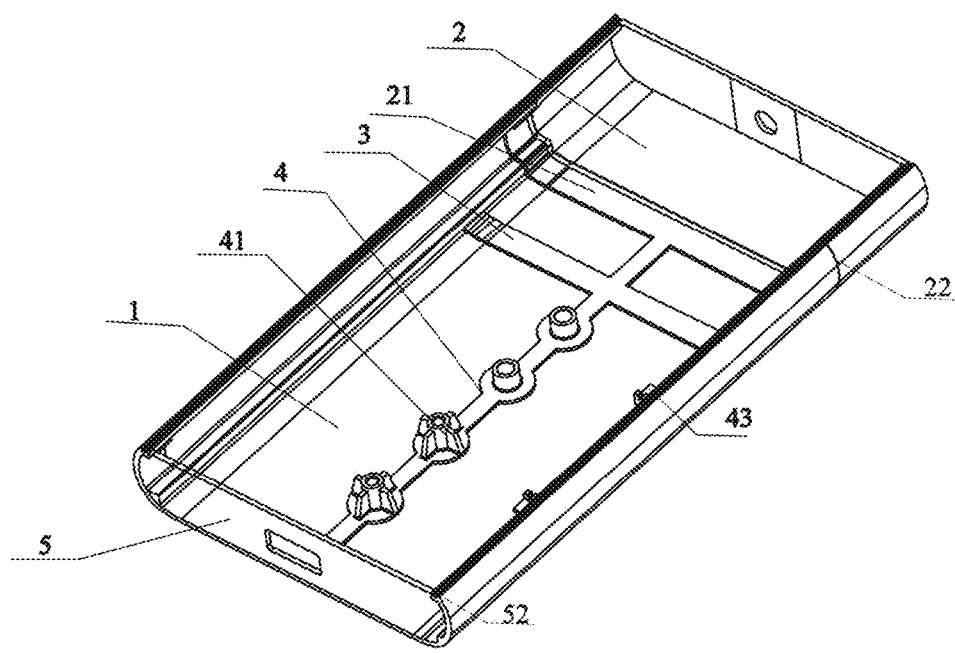
FIG. 6 shows a schematic diagram of a mobile phone shell according to one embodiment of present disclosure.

The dried aluminum alloy shell was inserted into an injection mold with a pattern shown in FIG. 5. A resin composition containing a polyphenylene sulfide (PPS) resin and 30 wt % fiberglass was injection molded. The shell for cell phone which was a firm combination of aluminum alloy and resin composite was obtained after being demolded and cooled, as shown in FIG. 6.

As shown in FIG. 5, the formed plastic part comprised a plastic shell body 2, a plastic patch 3, a plastic support 4 and a plastic basal plate 5, which were integrally formed. The plastic shell body 2 was provided on one end of the aluminum alloy shell 1, and the plastic shell body 2 matched with the aluminum alloy shell 1 very well. The interface between the plastic shell body 2 and the end of the aluminum alloy shell 1 formed a first connection surface 22, and the connection force between the aluminum alloy shell 1 and the plastic shell body 2 was formed by the first connection surface 22. The plastic basal plate 5 was provided on the other end of the aluminum alloy shell 1, and was vertical to the aluminum alloy shell 1. A second connection surface 52 was formed by the interface between the plastic basal plate 5 and aluminum alloy shell 1, and the connection force between the aluminum alloy shell 1 and the plastic basal plate was formed by the second connection surface 52. A strengthening rib 51 extending along the inner surface of the aluminum alloy shell 1 from the plastic basal plate 5 was formed, and strengthening rib 51 was joined to the inner surface of the aluminum alloy shell 1 to increase the connection force between the plastic part and the metal shell body. The plastic shell body 2 was connected with the plastic basal plate 5 via a plastic support 4 provided in the inner surface of the metal shell body 1. The plastic support 4 provides a framework, and a support rod 42 was provided in the middle of the framework. Some screwed holes were formed in the support rod 42. The support rod 42 was joined to the middle area of the inner surface of the aluminum alloy shell body 1. The plastic support 4 was perpendicular to the plastic basal plate 5, and the framework 44 having a buckle 43 thereon was joined to the edges of the metal shell body 1. The screw hole 41 and buckles 43 disposed in the framework 4 were used to mount the some parts within the cell phone. The plastic patch 3 was provided on the plastic support 4, and was perpendicular to the support rod 42, forming a cross together, and the end of the plastic patch 3 may also be engaged to the framework 44. An opening 11 was formed in the outer surface of the shell, i.e. under the surface of the plastic patch 3 to expose a part of the plastic patch 3, avoiding the shielding by the metal. (See FIG. 4). The plastic shell body 2, plastic patch 3, plastic support 4 and the plastic basal plate 5 were integrally formed via injection molding. A strengthening rib 21 extended from the inner surface from the plastic shell body 2, and the strengthening rib 21 were joined to the metal shell body 1, strengthening the connection force between the plastic part and the aluminum shell body. The plastic shell body 2 may be used to mount some parts such as antenna, display screen, plastic patch 3 may be used to mount WIFI antenna, and plastic basal plate 5 may be used to mount antennas for GPRS, Bluetooth, and infrared.

5. Surface Burnishing, and Abrasion Blasting

The resulting shell after injection molding was subject to surface burnishing using a 400 mesh sand paper, and abrasion blasting using 500 mesh ceramic beads.

6. Anodization

The resulting shell was placed, as an anode, in an anodizing bath containing a 20 wt % $H_2SO_4$ solution. The shell was electrolyzed at a voltage of 20V at 20° C. for 140 min, and then after washing.

EXAMPLE 2

In this example, a shell for cell phone was prepared by a method which was substantially the same as the method in Example 1, with the following exceptions.

In the step of surface treatment 1, each aluminum alloy shell body was placed as an anode in an anodizing bath containing a 20 wt % $H_2SO_4$ solution, the aluminum alloy shell body was electrolyzed at a voltage of 15V at 18° C. for 10 min, and then blow-dried.

It was observed that a layer of aluminum oxide film having a thickness of about 5 μm was formed after electrolysis, and nanopores having a size of 20-40 nm were formed in the aluminum oxide layer. After surface treatment 2, corrosion pores with a size of 300-1000 nm and a depth of 4 μm were formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 3

In this example, a shell for cell phone was prepared by a method which is substantially the same as the method in Example 1, with the following exceptions.

In the step of surface treatment 1, each aluminum alloy shell body was placed as an anode in an anodizing bath containing a 20 wt % $H_2SO_4$ solution, the aluminum alloy shell body was electrolyzed at a voltage of 40V at 18° C. for 10 min, and then blow-dried.

It was observed that a layer of aluminum oxide film having a thickness of about 5 μm was formed after electrolysis, and nanopores having a size of 60-80 nm and a depth of 1 μm were formed in the aluminum oxide layer. After surface treatment 2, corrosion pores with a size of 300-1000 nm and a depth of 4 μm were formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 4

In this example, a shell for cell phone was prepared by a method which is substantially the same as the method in Example 1, with the following exceptions.

In the step of surface treatment 1, each aluminum alloy shell body was placed as an anode in an anodizing bath containing a 20 wt % $H_2SO_4$ solution, the aluminum alloy shell body was electrolyzed at a voltage of 20V at 18° C. for 15 min, and then blow-dried.

It was observed that a layer of aluminum oxide film having a thickness of about 7 μm was formed after electrolysis, and nanopores having a size of 40-60 nm and a depth of 3 μm were formed in the aluminum oxide layer. After surface treatment 2, corrosion pores with a size of 300-1000 nm and a depth of 4 μm were formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 5

In this example, a shell for cell phone was prepared by a method which is substantially the same as the method in Example 1, with the following exceptions.

In the step of surface treatment 1, each aluminum alloy shell body was placed as an anode in an anodizing bath containing a 20 wt % $H_2SO_4$ solution, the aluminum alloy shell body was electrolyzed at a voltage of 15V at 18° C. for 15 min, and then blow-dried.

It was observed that a layer of aluminum oxide film having a thickness of about 7 μm was formed after electrolysis, and nanopores having a size of 20-40 nm and a depth of 3 μm were formed in the aluminum oxide layer. After surface treatment 2, corrosion pores with a size of 300-1000 nm and a depth of 4 μm were formed on the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 6

In this example, a shell for cell phone was prepared by a method which is substantially the same as the method in Example 1, with the following exceptions.

In the step of surface treatment 1, each aluminum alloy shell body was placed as an anode in an anodizing bath containing a 20 wt % $H_2SO_4$ solution, the aluminum alloy shell body was electrolyzed at a voltage of 40V at 18° C. for 15 min, and then blow-dried.

It was observed that a layer of aluminum oxide film having a thickness of about 7 μm was formed after electrolysis, and nanopores having a size of 60-80 nm and a depth of 3 μm were formed in the aluminum oxide layer. After surface treatment 2, corrosion pores with a size of 300-1000 nm and a depth of 4 μm were formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 7

In this example, a shell for cell phone was prepared by a method which was substantially the same as the method in Example 2, with the following exceptions.

Aqueous solution containing 5 wt % $Na_2CO_3$ with pH=11.9 in the amount of 100 ml was prepared in a beaker. The aluminum alloy shell body after step (2) was immersed in the sodium carbonate solution, taken out after 5 min, and immersed in a beaker containing water for 1 min. After 5 cycles, after immersing in the water for the last time, the aluminum alloy shell body was blow-dried.

It was observed that a layer of aluminum oxide film having a thickness of about 5 μm was formed after electrolysis, and nanopores having a size of 20-40 nm and a depth of 3 μm were formed in the aluminum oxide layer. After surface treatment 2, corrosion pores with a size of 300-600 nm and a depth of 2 μm were formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

EXAMPLE 8

In this example, a shell for cell phone was prepared by a method which is substantially the same as the method in Example 2, with the following exceptions.

Aqueous solution containing 15 wt % $NaHCO_3$ with pH=10 in the amount of 100 ml was prepared in a beaker. The aluminum alloy shell body after step (2) was immersed in the sodium carbonate solution, taken out after 5 min, and immersed in a beaker containing water for 1 min. After 5 cycles, after water immersing for the last time, the aluminum alloy shell body was blow-dried.

It was observed that a layer of aluminum oxide film having a thickness of about 5 μm was formed after electrolysis, and nanopores having a diameter of 20-40 nm and a depth of 3 μm were formed in the aluminum oxide layer. After surface treatment 2, corrosion pores with a size of 300-600 nm and a depth of 2 μm was formed in the surface of the immersed aluminum alloy sheet. It may also be observed that there was a double-layer three-dimensional pore structure in the aluminum oxide layer similar to the structure shown in FIG. 1, and the corrosion pores were in communication with the nanopores. A shell for cell phone was then prepared.

COMPARATIVE EXAMPLE 1

1. Pretreatment

A commercially available A5052 aluminum alloy shell body with a thickness of 1 mm was cut into 15 mm×80 mm rectangular shells, which were then polished in a polishing machine, and cleaned with water-free ethanol, and then immersed in a 2 wt % NaOH aqueous solution. After 2 min, the rectangular sheets were washed with water and dried to obtain pretreated aluminum alloy sheets.

2. Adhesion

Hot melt adhesive, for example, the adhesive from 3M Company, is coated to the connection surface between the metal the plastic parts. The two parts were then joined via hot pressing.

Performance Test

The connection force of the aluminum alloy and the resin: the shells for cell phones prepared in Examples 1-8 and Comparative example 1 were fixed in a universal material testing machine to perform tensile test. The test results under maximum load can be regarded as the connection force value between the aluminum alloy and the resin. The test results were summarized in Table 1.

TABLE 1

| | Thickness of oxide layer/μm | Diameter of nanopores/nm | Depth of nanopores/μm | Diameter of corrosion pores/nm | Depth of nanopores/μm | Joining force/N |
|---|---|---|---|---|---|---|
| Ex. 1 | 5 | 40-60 | 1 | 300-1000 | 4 | 1261 |
| Ex. 2 | 5 | 20-40 | 1 | 300-1000 | 4 | 1229 |
| Ex. 3 | 5 | 60-80 | 1 | 300-1000 | 4 | 1240 |
| Ex. 4 | 7 | 40-60 | 3 | 300-1000 | 4 | 1211 |
| Ex. 5 | 7 | 20-40 | 3 | 300-1000 | 4 | 1259 |
| Ex. 6 | 7 | 60-80 | 3 | 300-1000 | 4 | 1236 |
| Ex. 7 | 5 | 20-40 | 3 | 300-600 | 2 | 1222 |
| Ex. 8 | 5 | 20-40 | 3 | 300-600 | 2 | 1255 |
| Comp. Ex. 1 | | | | | | 357 |

It can be seen from Table 1 that the joining force between the resin and the metal shell body in the shell of the present disclosure can achieve up to 1211 N. While the joining force between the resin and the metal shell body in conventional shell is just tens or hundreds of newton. The performance of the shell in the present disclosure has been improved significantly compared to the conventional ones and the resin molding is easier. The metal shell body in the present disclosure may not need additional bonding to join firmly with the resin. The process has little effect on size of the metal substrate and appearance of the aluminum alloy. At the same time, it is easier to inject mold resin directly into the corrosion holes with a larger surface area. It also has no specific requirement with synthetic resin, so that the application scope is wider. There is no environmental pollution which is more suitable for mass production.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A shell comprising:
a metal shell body;
a plastic part made of a type of resin material; and
an oxide layer formed between the metal body and the plastic part, joining the plastic part to the metal shell body, wherein the oxide layer contains corrosion pores at a surface contacting the plastic part, and nanopores at a surface contacting the metal shell body, the corrosion pores are larger than the nanopores in diameter, and the corrosion pores are in communication with the nanopores, and wherein the corrosion pores and nanopores are filled with the same type of resin material via injection molding.

2. The shell according to claim 1, wherein the plastic part further comprises:

a strengthening rib made of a resin, extending along an inner surface of the metal shell body;

wherein the strengthening rib is joined to an inner surface of the metal shell body.

3. The shell according to claim 1, wherein the plastic part comprises:

a plastic patch provided on an inner surface of the metal shell body, and joined to the inner surface of the metal shell body, wherein the oxide layer is formed between the plastic patch and the inner surface of the metal shell body, joining the plastic patch to the inner surface of the metal shell body.

4. The shell according to claim 1, wherein the plastic part comprises:

a plastic support provided on an inner surface of the metal shell body, and joined to the inner surface of the metal shell body, wherein the oxide layer is formed between the plastic support and the inner surface of the metal shell body, joining the plastic support to the inner surface of the metal shell body.

5. The shell according to claim 1, wherein the plastic part comprises:

a plastic basal plate provided on an end of the metal shell body, wherein:

the plastic basal plate is perpendicular to the metal shell body, and an edge of the plastic basal plate is joined to an inner surface or the end of the metal shell body, the oxide layer is formed between the plastic basal plate and the inner surface or the end of the metal shell body, joining the plastic basal plate to the inner surface or the end of the metal shell body.

6. The shell according to claim 1, wherein the resin includes a thermoplastic resin.

7. The shell according to claim 6, wherein the thermoplastic resin comprises a polyolefin resin.

8. The shell according to claim 7, wherein the thermoplastic resin further comprises a mixture of polyphenylene ether and polyphenylene sulfide, and the polyolefin resin has a melting point of about 65° C. to about 105° C.

9. The shell according to claim 7, wherein the thermoplastic resin further comprises a mixture of polyphenylene oxide and a polyamide, and the polyolefin resin has a melting point of about 65° C. to about 105° C.

10. The shell according to claim 7, wherein the thermoplastic resin further comprises a polycarbonate, and the polyolefin resin has a melting point of about 65° C. to about 105° C.

11. The shell according to claim 7, wherein the polyolefin resin comprises a grafted polyethylene.

12. The shell according to claim 7, wherein based on 100 weight parts of the thermoplastic resin, the thermoplastic resin further comprises about 1 weight part to about 5weight parts of cyclic polyester.

13. The shell according to claim 7, wherein the thermoplastic resin further comprises at least one of a fiber filler and a powder filler, wherein the fiber filler includes at least one selected from the group consisting of fiberglass, carbon fiber and polyamide fiber, and the powder filler includes at least one selected from the group consisting of silica, talc, aluminum hydroxide, magnesium hydroxide, calcium carbonate, magnesium carbonate, glass and kaolin.

* * * * *